(12) United States Patent
Hsu et al.

(10) Patent No.: US 8,801,238 B2
(45) Date of Patent: Aug. 12, 2014

(54) LIGHT-EMITTING DEVICE

(75) Inventors: Shih-Chang Hsu, New Taipei (TW); Tsung-Chi Lee, New Taipei (TW); Po-Wei Li, New Taipei (TW)

(73) Assignees: Lite-On Electronics (Guangzhou) Limited, Guangzhou (CN); Lite-On Technology Corporation, Taipei (TW)

( * ) Notice: Subject to any disclaimer, the term of this patent is extended or adjusted under 35 U.S.C. 154(b) by 232 days.

(21) Appl. No.: 13/494,030

(22) Filed: Jun. 12, 2012

(65) Prior Publication Data

US 2013/0088870 A1 Apr. 11, 2013

(30) Foreign Application Priority Data

Oct. 11, 2011 (CN) .......................... 2011 1 0305497

(51) Int. Cl.
*B60Q 1/06* (2006.01)
(52) U.S. Cl.
USPC ..................................... 362/373; 362/249.02
(58) Field of Classification Search
CPC ........... H01L 2924/00014; H01L 2224/48091; H01L 2224/73265; H01L 2224/48247
USPC ..................................... 362/373, 249.02, 294
See application file for complete search history.

(56) References Cited

U.S. PATENT DOCUMENTS 8,097,476 B2 * 1/2012 Jong et al. ........................ 438/26
8,564,005 B2 * 10/2013 Park et al. ........................ 257/98

* cited by examiner

*Primary Examiner* — Vip Patel
(74) *Attorney, Agent, or Firm* — Li & Cai Intellectual Property (USA) Office

(57) ABSTRACT

A light-emitting device includes a light-emitting element and a heat-conducting and electrically-insulating element. The light-emitting element includes at least one first conductive frame having at least one first electrically-conducting portion and at least one heat-dissipating portion, at least one second conductive frame adjacent to the first conductive frame and having at least one second electrically-conducting portion, a casing enclosing the first conductive frame and the second conductive frame, and at least one light-emitting chip disposed on the first conductive frame. The heat-conducting and electrically-insulating element includes a heat-conducting and electrically-insulating layer disposed on the heat-dissipating portion for insulating an electrical current from the heat-dissipating portion. Hence, the instant disclosure can plan a heat-conduction path and an electric-conduction path for the light-emitting chip to effectively increase the heat-dissipating efficiency of the light-emitting element due to the design of placing the heat-conducting and electrically-insulating layer on the heat-dissipating portion.

19 Claims, 16 Drawing Sheets

LIGHT-EMITTING DEVICE

BACKGROUND OF THE INVENTION

1. Field of the Invention

The instant disclosure relates to a light-emitting device, and more particularly to a light-emitting device for increasing the heat-dissipating efficiency.

2. Description of Related Art

In recent years, the LED has been widely used in several applications and entered into everyone's daily life.

However, the heat-dissipating efficiency of the conventional LED device cannot be increased efficiently, especially to the LED device having the same path for conducting heat and electric power.

SUMMARY OF THE INVENTION

One aspect of the instant disclosure relates to a light-emitting device that can plan a shortest heat-conduction path and an electric-conduction path, thus the heat-dissipating efficiency and the light-emitting efficiency of the light-emitting device can be increased efficiently.

In conclusion, the instant disclosure can plan the heat-conduction path and the electric-conduction path for a light-emitting chip in order to effectively increase the heat-dissipating efficiency of a light-emitting element due to the design of placing the heat-conducting and electrically-insulating layer on the heat-dissipating portion. In addition, even if the light-emitting element uses a vertical type LED chip, the light-emitting element also can be disposed on the substrate unit having a heat-dissipating design with a plurality of penetrating heat-conducting structures due to the design of placing the heat-conducting and electrically-insulating layer on the heat-dissipating portion. Hence, no matter what the light-emitting element uses at least one vertical or horizontal type LED chip, the light-emitting element can be disposed on the substrate unit having the penetrating heat-conducting structures for further increasing the heat-dissipating efficiency of the light-emitting device of the instant disclosure.

To further understand the techniques, means and effects of the instant disclosure applied for achieving the prescribed objectives, the following detailed descriptions and appended drawings are hereby referred, such that, through which, the purposes, features and aspects of the instant disclosure can be thoroughly and concretely appreciated. However, the appended drawings are provided solely for reference and illustration, without any intention to limit the instant disclosure.

DETAILED DESCRIPTION OF THE PREFERRED EMBODIMENTS

[First Embodiment]

Figure 1A:
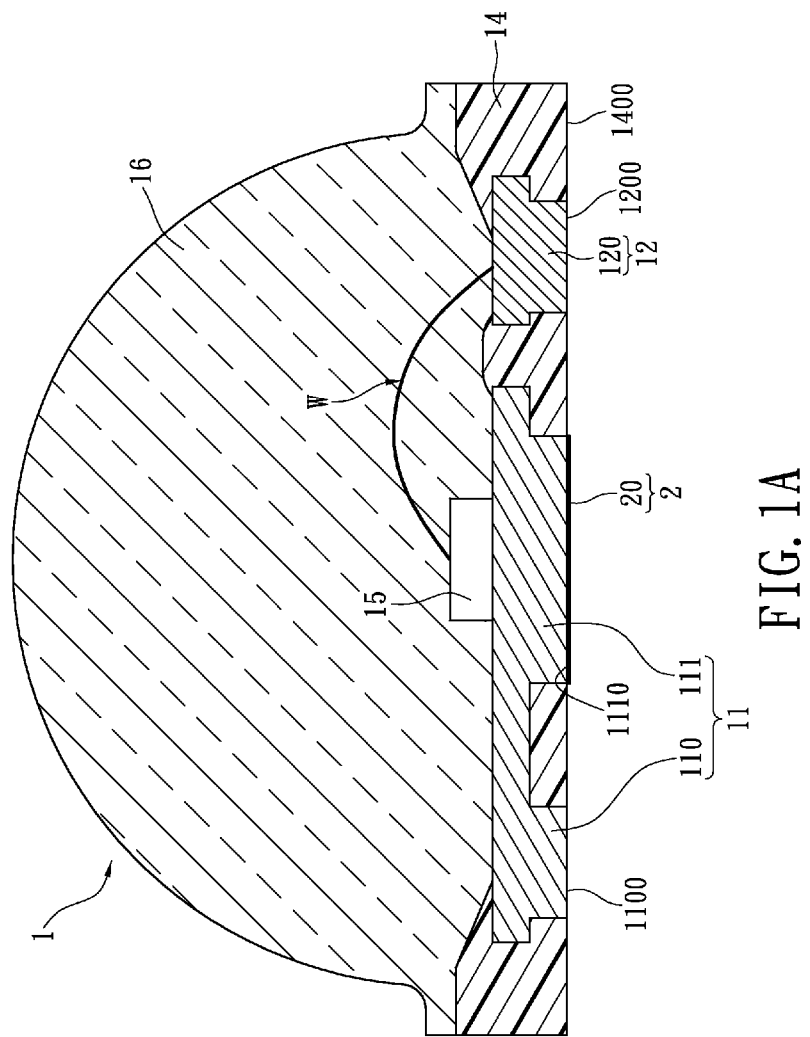
FIG. 1A shows a lateral, cross-sectional, schematic view of the heat-conducting and electrically-insulating element disposed on the bottom side of the light-emitting element according to the first embodiment of the instant disclosure.
Figure 1B:
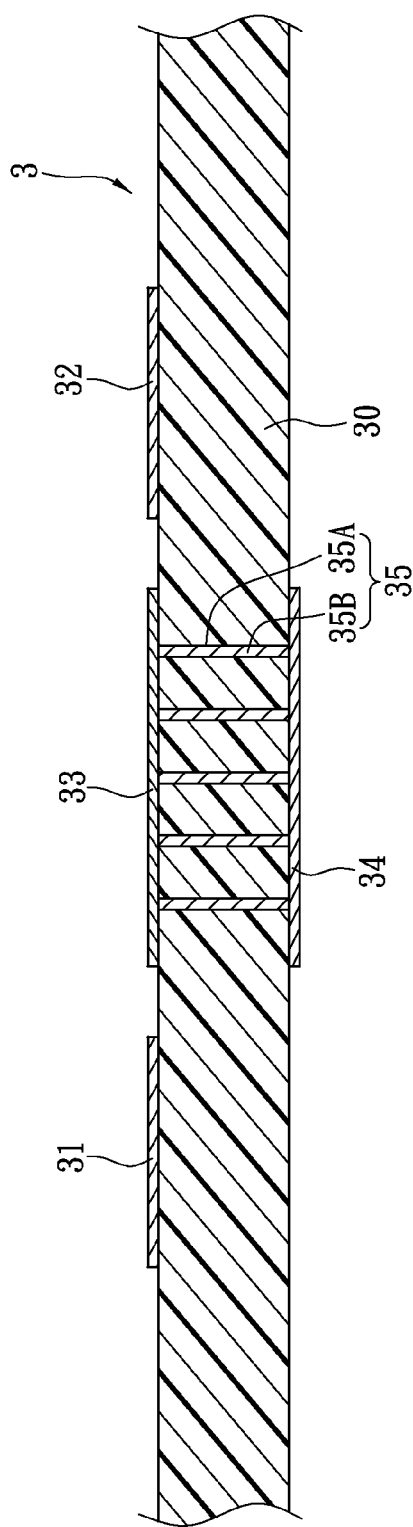
FIG. 1B shows a lateral, cross-sectional, schematic view of the substrate unit according to the first embodiment of the instant disclosure.
Figure 1C:
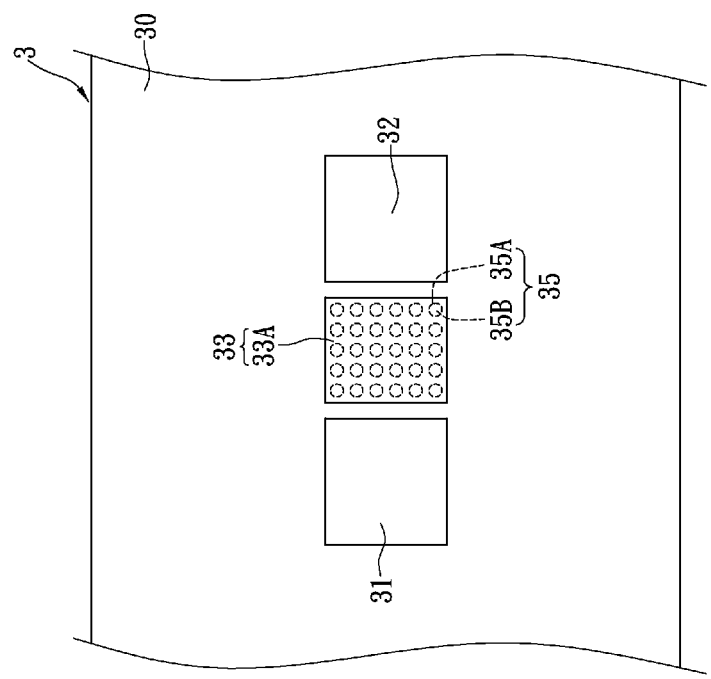
FIG. 1C shows a top, schematic view of the substrate unit according to the first embodiment of the instant disclosure.
Figure 1D:
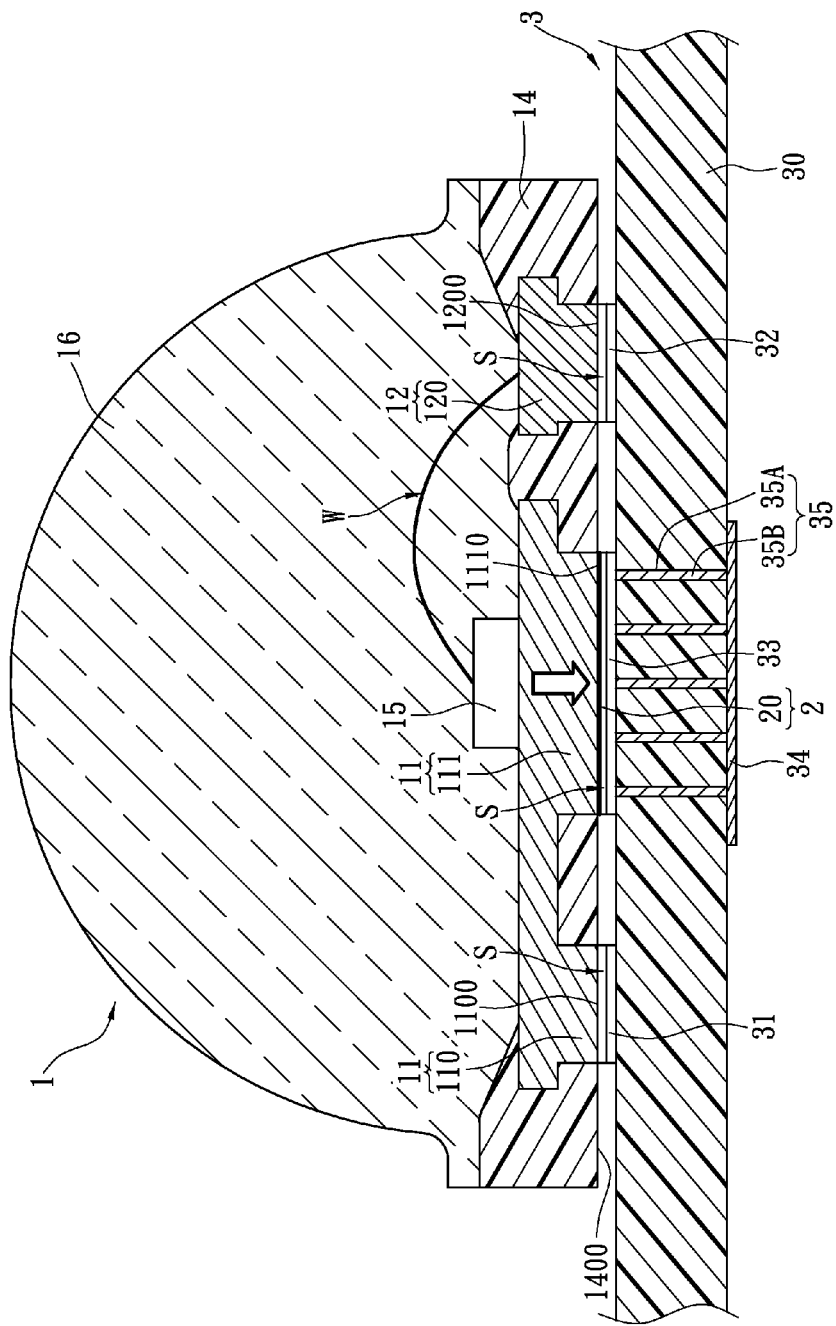
FIG. 1D shows a lateral, cross-sectional, schematic view of the light-emitting device according to the first embodiment of the instant disclosure.

Referring to FIG. 1A to FIG. 1D, where FIG. 1A shows a lateral, cross-sectional, schematic view of the heat-conducting and electrically-insulating element disposed on the bottom side of the light-emitting element, FIG. 1B shows a lateral, cross-sectional, schematic view of the substrate unit, FIG. 1C shows a top, schematic view of the substrate unit, and FIG. 1D shows a lateral, cross-sectional, schematic view of the light-emitting device. As shown in the above-mentioned figures, the first embodiment of the instant disclosure provides a light-emitting device, comprising: a light-emitting element 1, a heat-conducting and electrically-insulating element 2, and a substrate unit 3.

As shown in FIG. 1A, the light-emitting element 1 includes at least one first conductive frame 11, at least one second conductive frame 12, a casing 14, at least one light-emitting chip 15, and a package resin body 16.

In addition, the first conductive frame 11 and the second conductive frame 12 can be separated from each other by a predetermined distance and adjacent to each other. The first conductive frame 11 and the second conductive frame 12 can be respectively defined as "a lead frame with positive electrode and a lead frame with negative electrode" or "a lead frame with negative electrode and a lead frame with positive electrode" according to different requirements. The first conductive frame 11 has at least one first electrically-conducting portion 110 exposed from the casing 14 and at least one heat-dissipating portion 111 exposed from the casing 14, and the second conductive frame 12 has at least one second electrically-conducting portion 120 exposed from the casing 14. The first electrically-conducting portion 110 and the second electrically-conducting portion 120 can be used as two electrodes for supplying power to the light-emitting chip, and the heat-dissipating portion 111 is very close to the light-emitting chip 15, thus the instant disclosure can provide a shortest heat-dissipating path between the light-emitting chip 15 and the heat-dissipating portion 111 for the light-emitting element 1.

For example, this embodiment can provide a QFN (Quad Flat No lead) type light-emitting element 1, thus a first conductive region 1100 on the bottom portion of the first electrically-conducting portion 110, a second conductive region 1200 on the bottom portion of the second electrically-conducting portion 120, and a heat-conducting region 1110 on the bottom portion of the heat-dissipating portion 111 can be exposed from the bottom surface 1400 of the casing 14, and the first conductive region 1100 of the first electrically-conducting portion 110, the second conductive region 1200 of the second electrically-conducting portion 120, and the heat-conducting region 1110 of the heat-dissipating portion 111 can be substantially coplanar with each other. However, the arrangement of the first conductive frame 11 and the second conductive frame 12 in the first embodiment is merely an example and is not meant to limit the instant disclosure.

Moreover, the casing 14 encloses the first conductive frame 11 and the second conductive frame 12 for connecting the first conductive frame 11 with the second conductive frame 12, thus the relative position between the first conductive frame 11 and the second conductive frame 12 can be fixed. In addition, the casing 14 can be made of insulating material in order to insulate the first conductive frame 11 from the second conductive frame 12. For example, the casing 14 can be designed as an annular light-reflecting body surrounding the light-emitting chip 15, thus light generated by the light-emitting chip 15 can be reflected and condensed by the inner light-reflecting surface of the annular light-reflecting body. However, the casing 14 used in the first embodiment is merely an example and is not meant to limit the instant disclosure.

Furthermore, the light-emitting chip 15 may be a vertical type LED chip, and the light-emitting chip 15 can be disposed on the first conductive frame 11 and electrically connected to the first conductive frame 11 and the second conductive frame 12. For example, the bottom surface of the light-emitting chip 15 can directly contact the first conductive frame 11, and the top surface of the light-emitting chip 15 can be electrically connected to the second conductive frame 12 through a conducting wire W such as a metal wire. In addition, when a heat-conducting and electrically-insulating layer 20 is disposed between the heat-dissipating portion 111 of the first conductive frame 11 and the substrate unit 3 (for example, an area of the heat-conducting and electrically-insulating layer 20 is smaller than or equal to that of the heat-dissipating portion 111), the electric power provided for the light-emitting chip 15 cannot be conducted from the heat-dissipating portion 111 of the first conductive frame 11 to the substrate unit 3 through the heat-conducting and electrically-insulating layer 20, thus a plurality of penetrating heat-conducting structures 35 can be disposed in the substrate unit 1 to increase the heat-dissipating efficiency of the light-emitting element 1. However, the vertical type LED chip used in the first embodiment is merely an example and is not meant to limit the instant disclosure. For example, the light-emitting chip 15 also can be a horizontal type LED chip, thus the vertical type LED chip used in the instant disclosure can be replaced by the horizontal type LED chip. Therefore, the light-emitting element 1 having any type of light-emitting chip can be disposed on the substrate unit 3 having the penetrating heat-conducting structures 35 due to the design of placing the heat-conducting and electrically-insulating layer 20 on the heat-dissipating portion 111.

In a better embodiment, the heat-conducting and electrically-insulating layer 20 is only disposed on the heat-dissipating portion 111 of the first conductive frame 11 and cannot be disposed on any region of the first conductive frame 11 and the second conductive frame 12. Hence, the instant disclosure can preferably plan the heat-conduction path (such as the heat-conduction path that can pass through the heat-dissipation portion 111 and the heat-conducting and electrically-insulating element 20 and the electric-conduction path (such as the electrical conduction path can pass through the first electrically-conducting portion 110 and the second electrically-conducting portion 120) for the light-emitting chip 15 so as to effectively increase the heat-dissipating efficiency of the light-emitting element 1 due to the design of only placing the heat-conducting and electrically-insulating layer 20 on the heat-dissipating portion 111.

In addition, the package resin body 16 can be formed inside a receiving space surrounded by the casing 14 to cover the light-emitting chip 15, thus the package resin body 16 not only can protect the light-emitting chip 15 that has been mounted by wire-bonding, but also can change the illumination pattern of the light source projected from the light-emitting chip 15. For example, the top portion of the package resin body 16 can be shown as a plane shape, a convex shape, etc. In addition, the package resin body 16 may be a transparent resin body formed by silicone or epoxy, or the package resin body 16 may be a fluorescent resin body formed by mixing phosphor powders with silicone or mixing phosphor powders with epoxy. When the light-emitting chip 15 is a white LED chip for generating white light and the package resin body 16 is a transparent resin body, thus the light generated by the light-emitting chip 15 can pass through the transparent resin body to generate white light. When the light-emitting chip 15 is a blue LED chip for generating blue light and the package resin body 16 is a fluorescent resin body, thus the blue light generated by the light-emitting chip 15 can pass through the fluorescent resin body to generate white light. However, the arrangement of the light-emitting chip 15 and the package resin body 16 in the first embodiment is merely an example and is not meant to limit the instant disclosure.

Moreover, as shown in FIG. 1A, the heat-conducting and electrically-insulating element 2 includes at least one heat-conducting and electrically-insulating layer 20 disposed on the heat-dissipating portion 111, and the heat-conducting region 1110 of the heat-dissipating portion 111 can be fully covered by the heat-conducting and electrically-insulating layer 20. For example, the heat-conducting and electrically-insulating layer 20 can be formed on the heat-dissipating portion 111 by coating, printing, or any other forming method. In addition, the heat-conducting and electrically-insulating layer 20 can be made of any type of heat-conducting and electrically-insulating material that has a thermal conductivity substantially between 120 W/mk and 500 W/mk, such as aluminum oxide, aluminum nitride, or DLC (Diamond-Like Carbon), etc. However, the heat-conducting and electrically-insulating layer 20 used in the first embodiment is merely an example and is not meant to limit the instant disclosure.

In general, the casing 14 can be made by silicone or epoxy that has a thermal conductivity substantially between 0.2 W/mk and 0.3 W/mk. The thermal conductivity of the ceramic material may be between about 2 W/mk and about 40

W/mk. The DLC material has a three-dimension thermal conductivity, such as about 475 W/mk along X direction, about 475 W/mk along Y direction, and about 120 W/mk along Z direction. Hence, when the instant disclosure chooses the DLC material as the heat-conducting and electrically-insulating layer 20, the heat-dissipating efficiency and capacity can be increased effectively.

Furthermore, as shown in FIG. 1B and FIG. 1C, the substrate unit 3 includes a substrate body 30, at least one first electrode layer 31, at least one second electrode layer 32, at least one top heat-conducting layer 33, at least one bottom heat-conducting layer 34, and a plurality of penetrating heat-conducting structures 35. All of the first electrode layer 31, the second electrode layer 32, and the top heat-conducting layer 33 can be disposed on the top side of the substrate body 30, and the top heat-conducting layer 33 can be disposed between the first electrode layer 31 and the second electrode layer 32. The first electrode layer 31, the second electrode layer 32, and the top heat-conducting layer 33 are insulated from each other and can be separated from each other by a predetermined distance. The first electrode layer 31 and the second electrode layer 32 can be respectively defined as "a positive electrode and a negative electrode" or "a negative electrode and a positive electrode" according to different requirements. In addition, the bottom heat-conducting layer 34 is disposed on the bottom side of the substrate body 30 and corresponds to the top heat-conducting layer 33. The penetrating heat-conducting structures 35 penetrate through the substrate body 30 and are disposed between the top heat-conducting layer 33 and the bottom heat-conducting layer 34.

For example, all of the first electrode layer 31, the second electrode layer 32, the top heat-conducting layer 33, and the bottom heat-conducting layer 34 can be copper foil layers. The top heat-conducting layer 33 has a contacting region 33A formed on the top surface thereof and between the first electrode layer 31 and the second electrode layer 32, and the penetrating heat-conducting structures 35 are disposed between the contacting region 33A of the top heat-conducting layer 33 and the bottom heat-conducting layer 34. In addition, each penetrating heat-conducting structure 35 may include a penetrating hole 35A penetrating through the substrate body 30 and a heat-conducting material 35B absolutely filling the penetrating hole 35A, and the heat-conducting material 35B can be disposed between the top heat-conducting layer 33 and the bottom heat-conducting layer 34. Hence, because each penetrating hole 35A can be filled with each corresponding heat-conducting material 35B, the penetrating heat-conducting structures 35 can provide best heat-dissipating velocity and best heat-dissipating effect for the light-emitting element 1. However, the substrate unit 3 used in the first embodiment is merely an example and is not meant to limit the instant disclosure.

Moreover, as shown in FIGS. 1A, 1B, and 1D, when the light-emitting element 1 is disposed on the substrate unit 3 (as shown in FIG. 1D), the first electrically-conducting portion 110 can correspond to the first electrode layer 31 and be electrically connected to the first electrode layer 31, the second electrically-conducting portion 120 can correspond to the second electrode layer 32 and be electrically connected to the second electrode layer 32, and the heat-conducting and electrically-insulating layer 20 can correspond to the top heat-conducting layer 33 and be disposed between the heat-dissipating portion 111 and the top heat-conducting layer 33. For example, the first electrically-conducting portion 110 and the second electrically-conducting portion 120 can be respectively electrically connected to the first electrode layer 31 and the second electrode layer 32 by corresponding solder paste S, and the heat-conducting and electrically-insulating layer 20 also can be disposed on the top heat-conducting layer 33 through a solder paste S having a heat-conducting function.

Furthermore, as shown in FIGS. 1C and 1D, the heat-conducting and electrically-insulating layer 20 having the high thermal conductivity can be disposed between the heat-dissipating portion 111 of the first conductive frame 11 and the contacting region 33A of the top heat-conducting layer 33, thus heat (shown as the downward blank arrow in FIG. 1D) generated by the light-emitting chip 15 can be conducted to the heat-conducting and electrically-insulating layer 20 through the heat-dissipating portion 111, and then the heat absorbed by the heat-conducting and electrically-insulating layer 20 can be efficiently conducted to the bottom heat-conducting layer 34 through the contacting region 33A of the top heat-conducting layer 33 and the penetrating heat-conducting structures 35 sequentially for heat dissipation. In other words, when the heat-conducting and electrically-insulating layer 20 with the high thermal conductivity is disposed between the heat-dissipating portion 111 and the contacting region 33A, the heat transmitted from the heat-conducting and electrically-insulating layer 20 to the contacting region 33A of the top heat-conducting layer 33 can be efficiently conducted to the bottom heat-conducting layer 34 through the penetrating heat-conducting structures 35 due to the penetrating heat-conducting structures 35 disposed between the contacting region 33A of the top heat-conducting layer 33 and the bottom heat-conducting layer 34, and then the heat conducted to the bottom heat-conducting layer 34 can be dissipated by the bottom heat-conducting layer 34.

When the heat-conducting and electrically-insulating layer 20 can be disposed on the heat-dissipating portion 111 of the first conductive frame 11, the electrical current cannot be conducted from the heat-conducting and electrically-insulating layer 20 to the top heat-conducting layer 33 due to the insulation property of the heat-conducting and electrically-insulating layer 20. In other words, the electrical current cannot pass through the heat-conducting and electrically-insulating layer 20, thus the heat-conducting and electrically-insulating layer 20 disposed on the heat-dissipating portion 111 can be used to insulate the electrical current from the heat-dissipating portion 111. In addition, the heat-conducting and electrically-insulating layer 20 can provide a shortest heat-dissipating path from the light-emitting chip 15 of the light-emitting element 1 to the bottom heat-conducting layer 34 of the substrate unit 3. Hence, the instant disclosure can freely plan the heat-conduction path and the electric-conduction path for the light-emitting chip 15 for effectively increasing the heat-dissipating efficiency of the light-emitting element 1 due to the design of placing the heat-conducting and electrically-insulating layer 20 on the heat-dissipating portion 111.

In conclusion, the heat (shown as the downward blank arrow in FIG. 1D) generated by the light-emitting chip 15 can be efficiently conducted to the heat-dissipating portion 111 of the first conductive frame 11, the heat-conducting and electrically-insulating layer 20, the solder paste S, the contacting region 33A of the top heat-conducting layer 33, the penetrating heat-conducting structures 35, and the bottom heat-conducting layer 34 sequentially, and then the heat can be dissipated by the bottom heat-conducting layer 34 finally. In other words, the heat generated by the light-emitting chip 15 can be efficiently conducted from the heat-dissipating portion 111 of the first conductive frame 11 to the contacting region 33A of the top heat-conducting layer 33 through the heat-conducting and electrically-insulating layer 20, and then the heat absorbed by the contacting region 33A of the top heat-conducting layer 33 can be efficiently conducted to the bottom heat-conducting layer 34 through the penetrating heat-conducting structures 35 for heat dissipation.

Therefore, the heat-dissipating effect of the light-emitting device can be increased efficiently by using the heat-conducting and electrically-insulating layer 20 and the penetrating heat-conducting structures 35. Especially, as shown in the first embodiment, when the light-emitting chip 15 is a vertical type LED bare chip applied to the light-emitting element 1, the instant disclosure can provide a shortest heat-dissipating path from the light-emitting chip 15 of the light-emitting element 1 to the bottom heat-conducting layer 34 of the substrate unit 3 due to the design of placing the heat-conducting and electrically-insulating layer 20 with the high thermal conductivity between the light-emitting element 1 and the substrate unit 3, thus the heat-dissipating effect of the light-emitting device in the first embodiment is very obvious.

[Second Embodiment]

Figure 2:
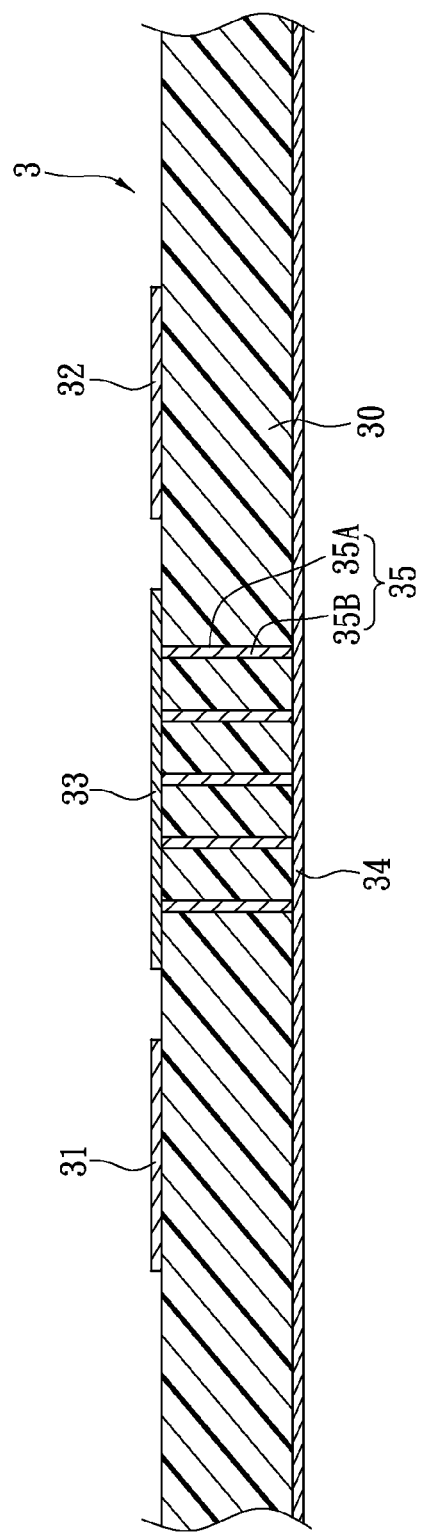
FIG. 2 shows a lateral, cross-sectional, schematic view of the substrate unit according to the second embodiment of the instant disclosure.

Referring to FIG. 2, where the second embodiment provides another substrate unit 3. Comparing FIG. 2 with FIG. 1B, the difference between the second embodiment and the first embodiment is shown as: the area of the bottom heat-conducting layer 34 can be larger than that of the top heat-conducting layer 33 in order to increase the heat dissipation effect in the second embodiment. In other words, the whole bottom surface 1400 of the substrate body 30 can be covered by the bottom heat-conducting layer 34, thus the bottom heat-conducting layer 34 with large area can provide a superior heat-dissipating effect for dissipating the heat that is conducted from the top heat-conducting layer 33 to the bottom heat-conducting layer 34 through the penetrating heat-conducting structures 35.

[Third Embodiment]

Figure 3:
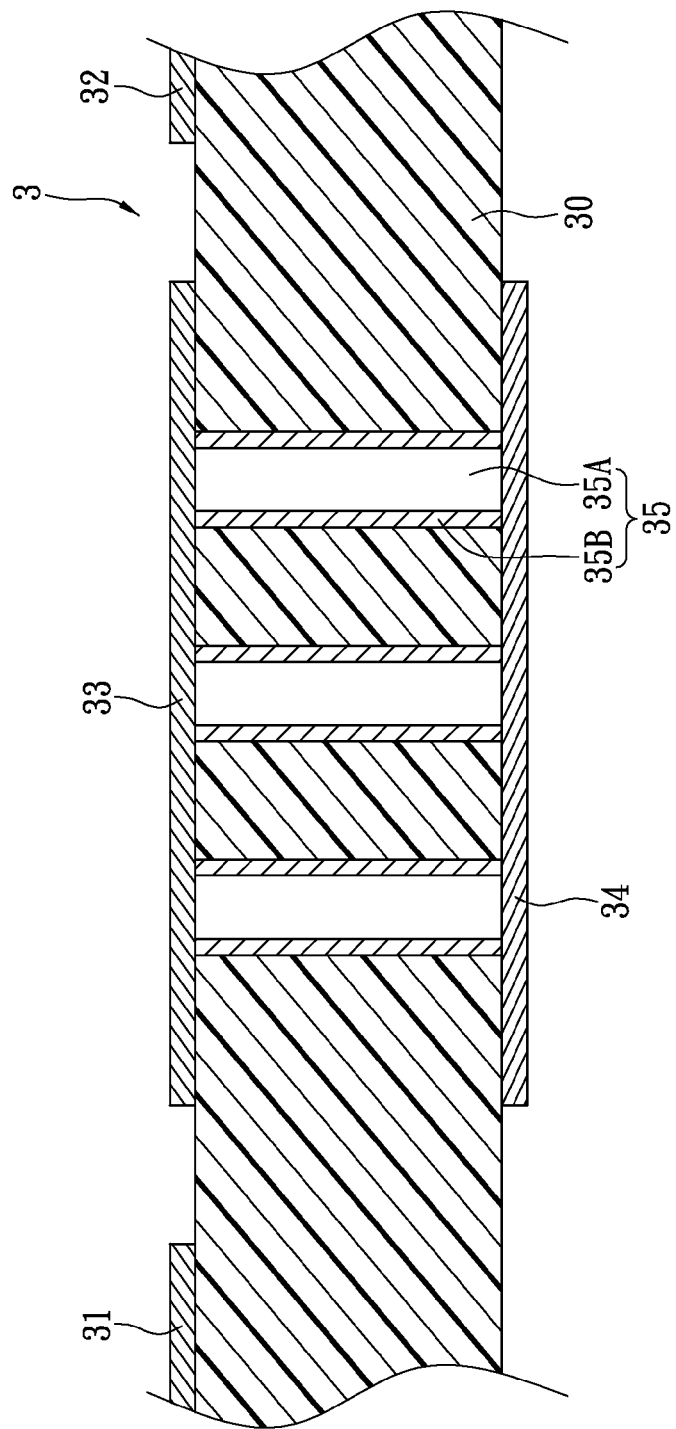
FIG. 3 shows a lateral, cross-sectional, schematic view of the substrate unit according to the third embodiment of the instant disclosure.

Referring to FIG. 3, where the third embodiment provides yet another substrate unit 3. Comparing FIG. 3 with FIG. 1B, the difference between the third embodiment and the first embodiment is shown as: in the third embodiment, each penetrating heat-conducting structure 35 includes a penetrating hole 35A penetrating through the substrate body 30 and a heat-conducting material 35B partially filling the penetrating hole 35A, and the heat-conducting material 35B is disposed between the top heat-conducting layer 33 and the bottom heat-conducting layer 34. For example, the heat-conducting material 35B is only coated on the inner surface of the penetrating hole 35A without filling up the penetrating hole 35A, thus the material cost of manufacturing the penetrating heat-conducting structures 35 can be reduced.

[Fourth Embodiment]

Figure 4:
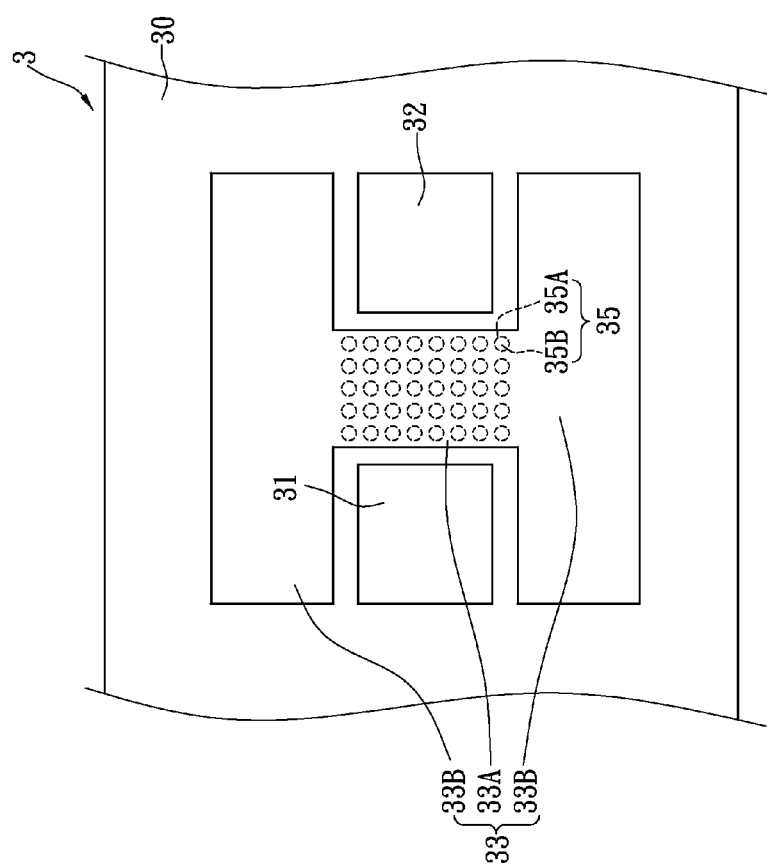
FIG. 4 shows a top, schematic view of the substrate unit according to the fourth embodiment of the instant disclosure.

Referring to FIG. 4, where the fourth embodiment provides yet another substrate unit 3. Comparing FIG. 4 with FIG. 1C, the difference between the fourth embodiment and the first embodiment is shown as: in the fourth embodiment, the top heat-conducting layer 33 has a contacting region 33A formed on the top surface thereof and between the first electrode layer 31 and the second electrode layer 32 and at least two extending regions 33B respectively connected to two opposite lateral sides of the contacting region 33A, and the penetrating heat-conducting structures 35 are disposed between the contacting region 33A and the bottom heat-conducting layer 34. The contacting region 33A and the two extending regions 33B can be connected with each other to form an I-shaped or an H-shaped heat-conducting layer. In other words, the fourth embodiment adds at least two extending regions 33B to the top heat-conducting layer 33, thus the area of the top heat-conducting layer 33 is larger than or equal to that of the heat-conducting and electrically-insulating layer 20. Therefore, the fourth embodiment can provide a superior heat-dissipating effect for dissipating the heat that is conducted from the top heat-conducting layer 33 to the bottom heat-conducting layer 34 through the penetrating heat-conducting structures 35 due to the design of the area of the top heat-conducting layer 33 being larger than or equal to that of the heat-conducting and electrically-insulating layer 20.

[Fifth Embodiment]

Figure 5:
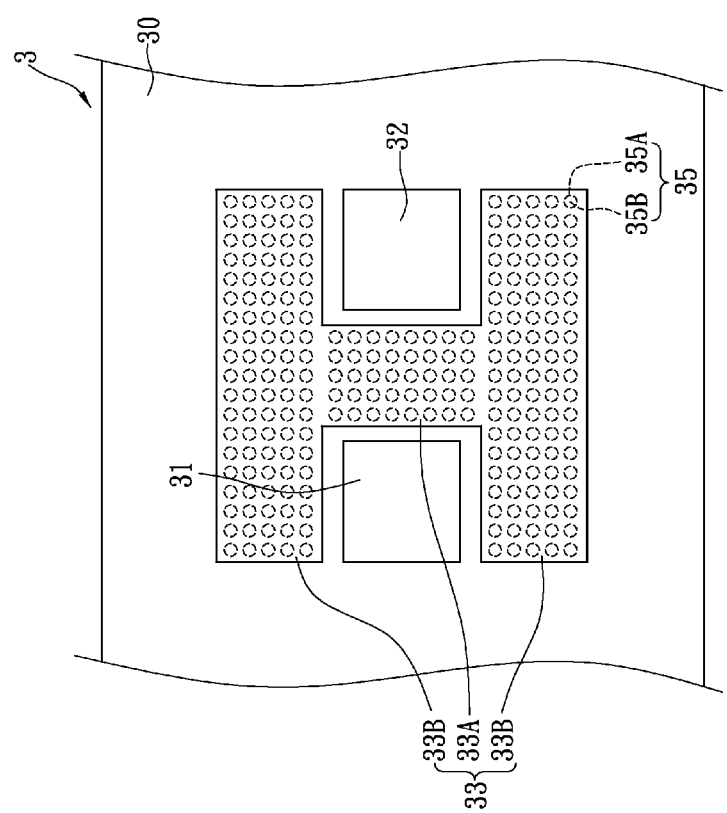
FIG. 5 shows a top, schematic view of the substrate unit according to the fifth embodiment of the instant disclosure.

Referring to FIG. 5, where the fifth embodiment provides yet another substrate unit 3. Comparing FIG. 5 with FIG. 4, the difference between the fifth embodiment and the fourth embodiment is shown as: in the fifth embodiment, the penetrating heat-conducting structures 35 can be simultaneously disposed between the contacting region 33A and the bottom heat-conducting layer 34 and between each extending region 33B and the bottom heat-conducting layer 34. In other words, some of the penetrating heat-conducting structures 35 are disposed between each extending region 33B and the bottom heat-conducting layer 34, thus the fifth embodiment can provide more heat-dissipating paths between the top heat-conducting layer 33 and the bottom heat-conducting layer 34. Therefore, the fifth embodiment can provide a superior heat-dissipating effect for dissipating the heat that is conducted from the top heat-conducting layer 33 to the bottom heat-conducting layer 34 through the penetrating heat-conducting structures 35 due to the design of increasing the number of the penetrating heat-conducting structures 35 between the top heat-conducting layer 33 and the bottom heat-conducting layer 34.

[Sixth Embodiment]

Figure 6A:
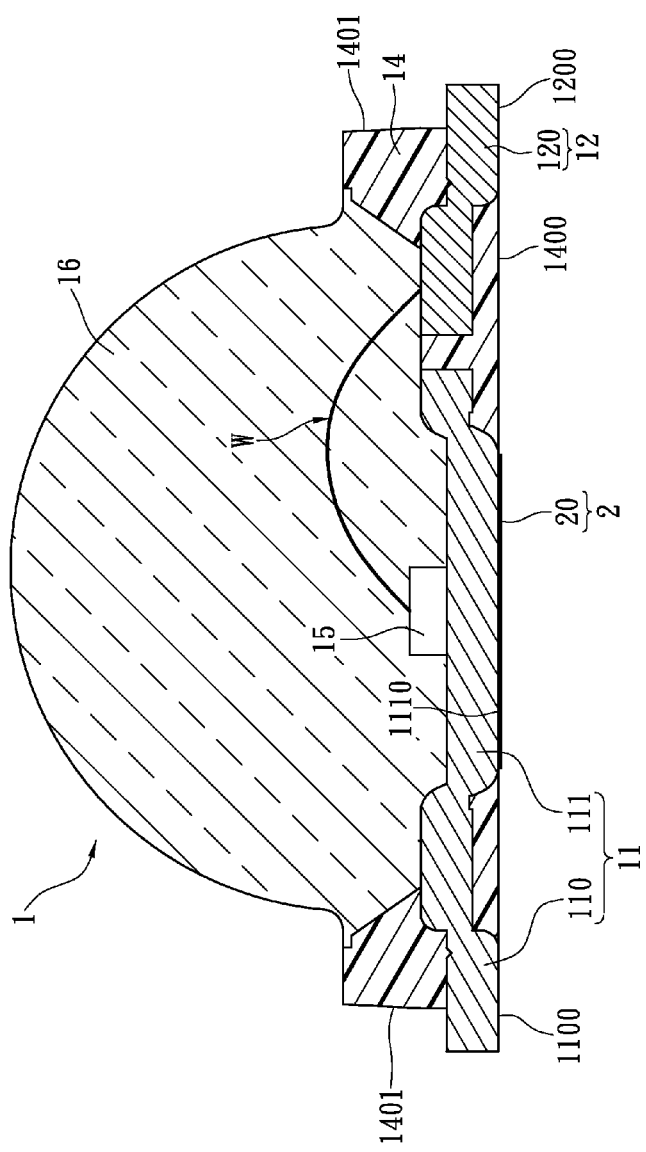
FIG. 6A shows a lateral, cross-sectional, schematic view of the heat-conducting and electrically-insulating element disposed on the bottom side of the light-emitting element according to the sixth embodiment of the instant disclosure.
Figure 6B:
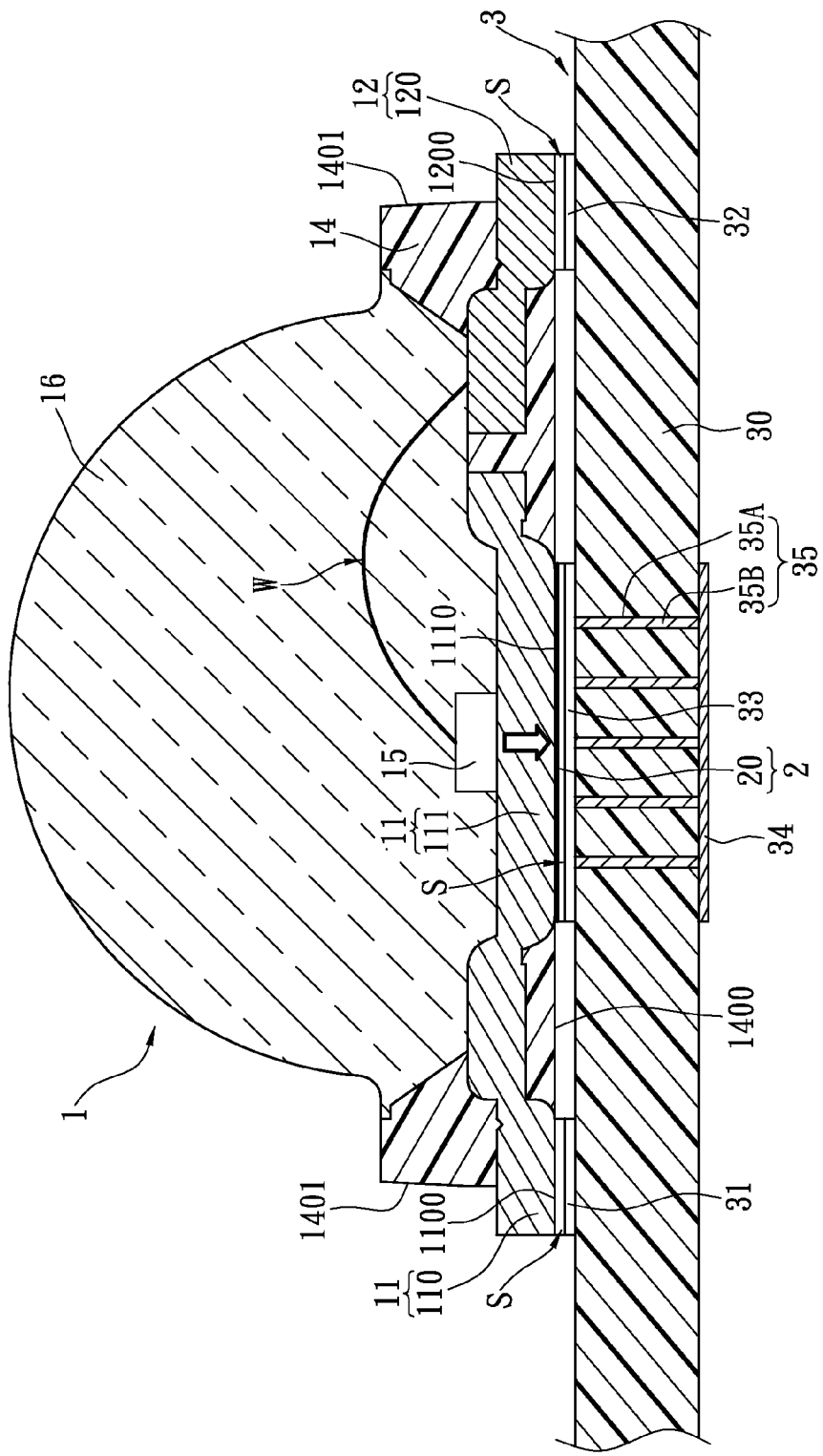
FIG. 6B shows a lateral, cross-sectional, schematic view of the light-emitting device according to the sixth embodiment of the instant disclosure.

Referring to FIG. 6A and FIG. 6B, where the sixth embodiment of the instant disclosure provides another light-emitting device, comprising: a light-emitting element 1, a heat-conducting and electrically-insulating element 2, and a substrate unit 3. Comparing FIG. 6A with FIG. 1A and comparing FIG. 6B with FIG. 1D, the difference between the sixth embodiment and the first embodiment is shown as: the fifth embodiment uses a SMD (Surface Mounted Device) type light-emitting element 1, thus one end of the first electrically-conducting portion 110 and one end of the second electrically-conducting portion 120 can be exposed outwardly from two opposite lateral sides 1401 of the casing 14, respectively. For example, the heat-conducting region 1110 of the heat-dissipating portion 111 can be exposed from the bottom surface 1400 of the casing 14, and all of the first conductive region 1100 of the first electrically-conducting portion 110, the second conductive region 1200 of the second electrically-conducting portion 120, and the heat-conducting region 1110 of the heat-dissipating portion 111 can be substantially coplanar with the bottom surface 1400 of the casing 14. However, the arrangement of the light-emitting element 1 in the sixth embodiment is merely an example and is not meant to limit the instant disclosure.

[Seventh Embodiment]

Referring to FIG. 7A to FIG. 7D, where the seventh embodiment provides yet another light-emitting device. The difference between the seventh embodiment and other embodiments is shown as: the seventh embodiment adds at least one third conductive frame 13 to the light-emitting element 1, and the third conductive frame 13 can be adjacent to the first conductive frame 11. The casing 14 can be enclosed the first conductive frame 11, the second conductive frame 12, and the third conductive frame 13. The same as the first embodiment, the light-emitting chip 15 can be disposed on the first conductive frame 11 and electrically connected to the second conductive frame 12 through the conducting wire W, thus the light-emitting chip 15 can be electrically connected between the first conductive frame 11 and the second conductive frame 12. Therefore, the heat-conducting and electrically-insulating layer 20 not only can be applied to the light-emitting element 1 having at least two conductive frames as shown in the first embodiment, but also can be applied to the light-emitting element 1 having at least three conductive frames as shown in the seventh embodiment.

Figure 7A:
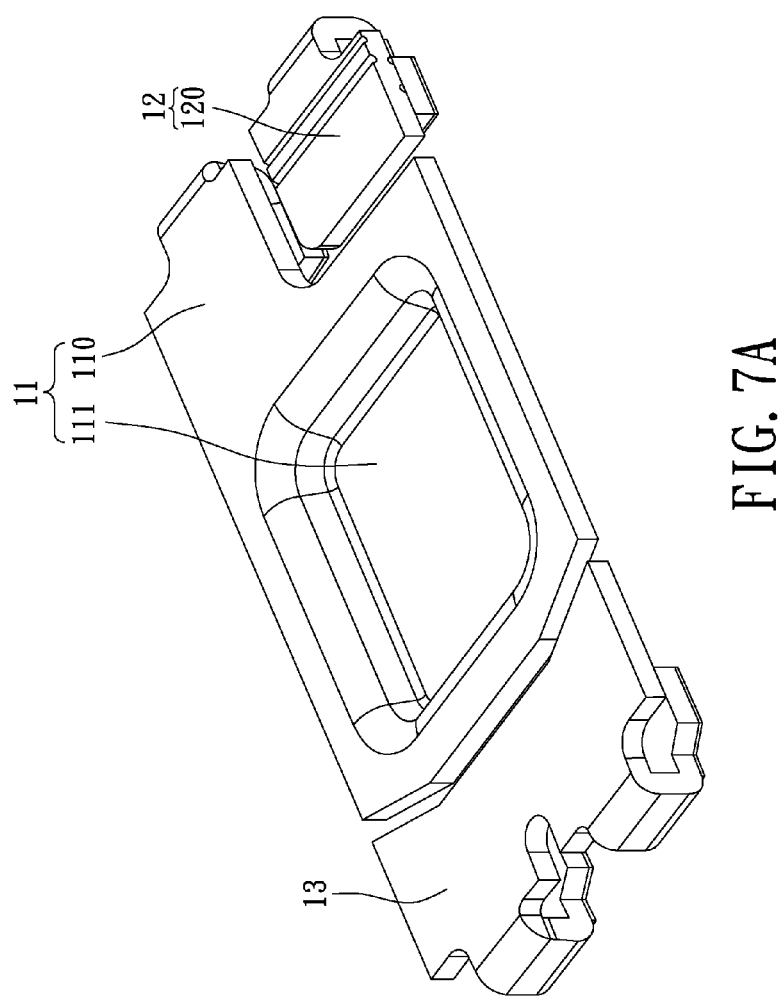
FIG. 7A shows a schematic view of the first, the second and the third conductive frames according to the seventh embodiment of the instant disclosure.
Figure 7B:
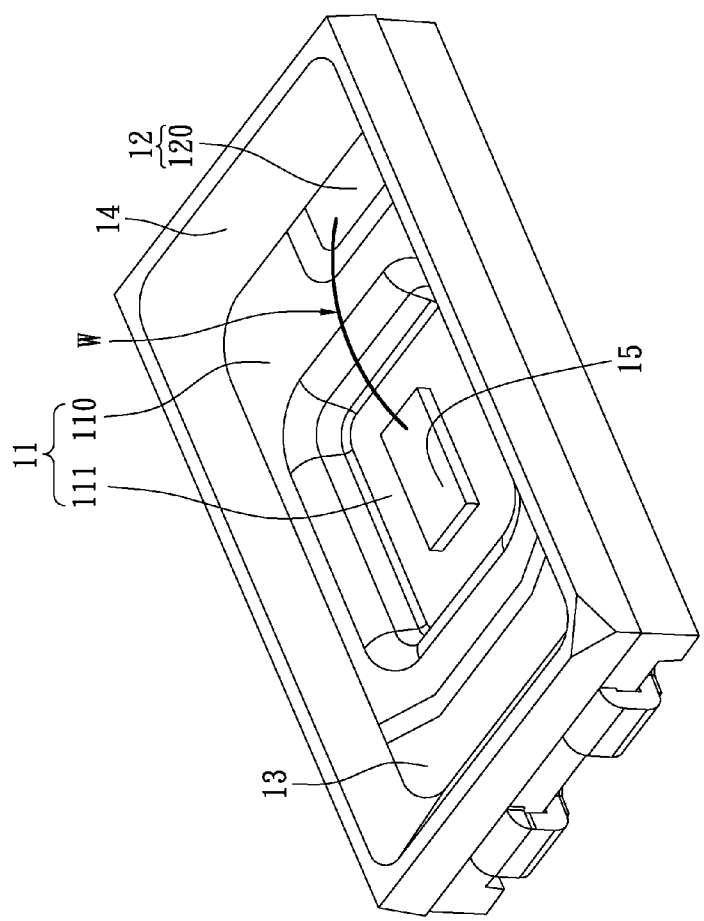
FIG. 7B shows a top, schematic view of the light-emitting element after removing the package resin body according to the seventh embodiment of the instant disclosure.
Figure 7C:
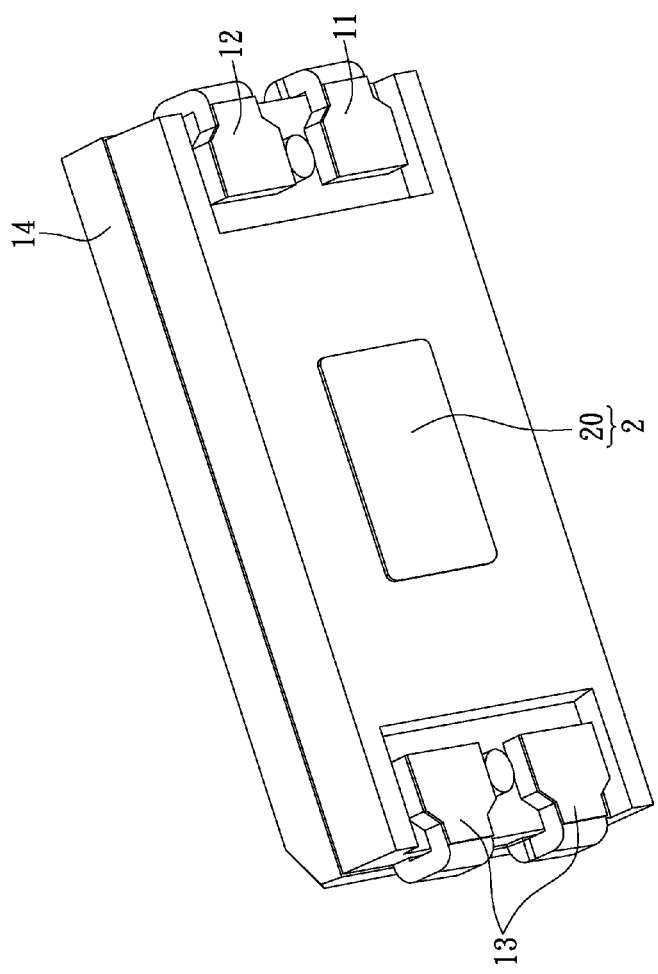
FIG. 7C shows a bottom, schematic view of the heat-conducting and electrically-insulating element disposed on the bottom side of the light-emitting element according to the seventh embodiment of the instant disclosure.
Figure 7D:
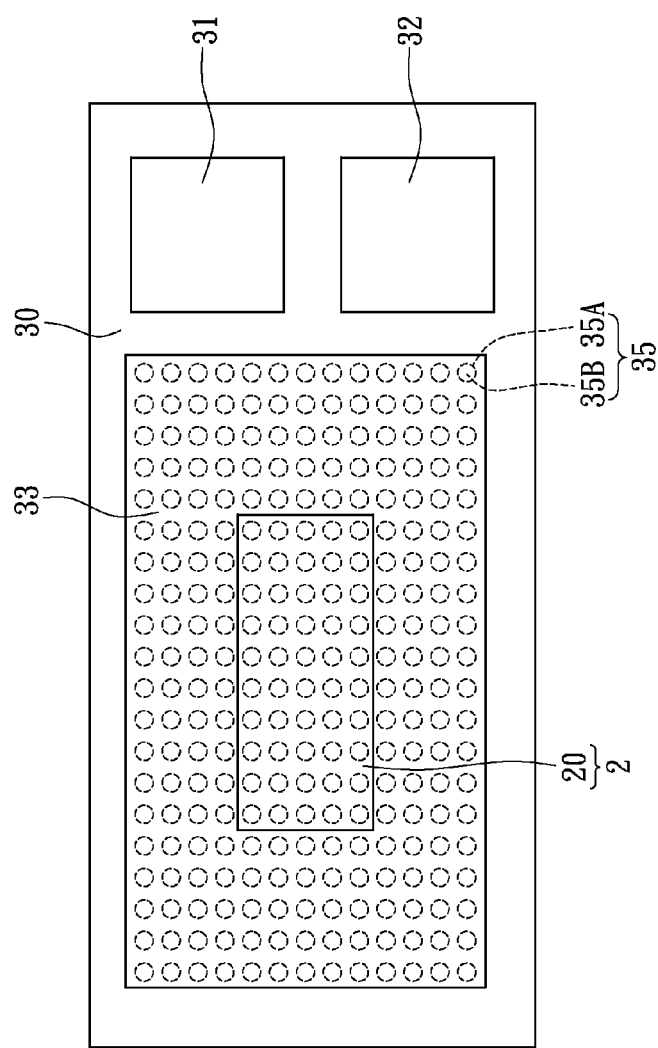
FIG. 7D shows a top, schematic view of the heat-conducting and electrically-insulating element disposed on the top side of the substrate unit according to the seventh embodiment of the instant disclosure.

Furthermore, as shown in FIGS. 7B, 7C, and 7D, the positions of the first electrode layer 31, the second electrode layer 32, and the top heat-conducting layer 33 can be adjusted correspondingly according to the positions of the first electrically-conducting portion 110 of the first conductive frame 11 and the second electrically-conducting portion 120 of the second conductive frame 12 for providing the electric-conduction paths (such as a positive conductive path and a negative conductive path) and the position of the heat-dissipating portion 111 of the first conductive frame 11 for providing the shortest heat-conduction path. For example, as shown in FIG. 7D, both the first electrode layer 31 and the second electrode layer 32 can be disposed on the same lateral region of the top side of the substrate body 30, the heat-conducting and electrically-insulating layer 20 can be disposed on the heat-dissipating portion 111 of the first conductive frame 11, and the top heat-conducting layer 33 can be disposed on another lateral region of the top side of the substrate body 30, according to the design of the positions of the first electrically-conducting portion 110, the second electrically-conducting portion 120, and the heat-dissipating portion 111.

In addition, as shown in FIG. 7D, the area of the top heat-conducting layer 33 can be larger than or equal to that of the heat-conducting and electrically-insulating layer 20. As the area of the top heat-conducting layer 33 is increased gradually, the heat-dissipating effect of the light-emitting device is improved accordingly. Of course, the same as other embodiments, the seventh embodiment also can use the penetrating heat-conducting structures 35 and the bottom heat-dissipating layer 34 with the larger area to increase the heat-dissipating effect of the light-emitting device. Moreover, the penetrating heat-conducting structures 35 can only be disposed under the heat-conducting and electrically-insulating layer 20, or the penetrating heat-conducting structures 35 can be distributed under the whole top heat-conductive layer 33. However, the distribution of the penetrating heat-conducting structures 35 can be adjusted according to different requirements, thus the distribution of the penetrating heat-conducting structures 35 in the seventh embodiment is not meant to limit the instant disclosure.

[Eighth Embodiment]

Figure 8A:
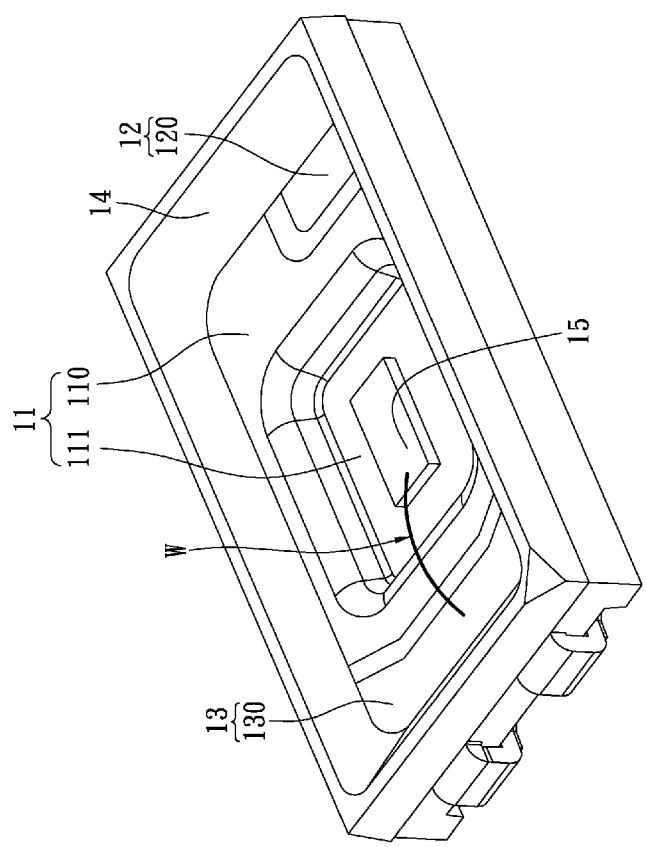
FIG. 8A shows a schematic view of the light-emitting element after removing the package resin body according to the eighth embodiment of the instant disclosure.
Figure 8B:
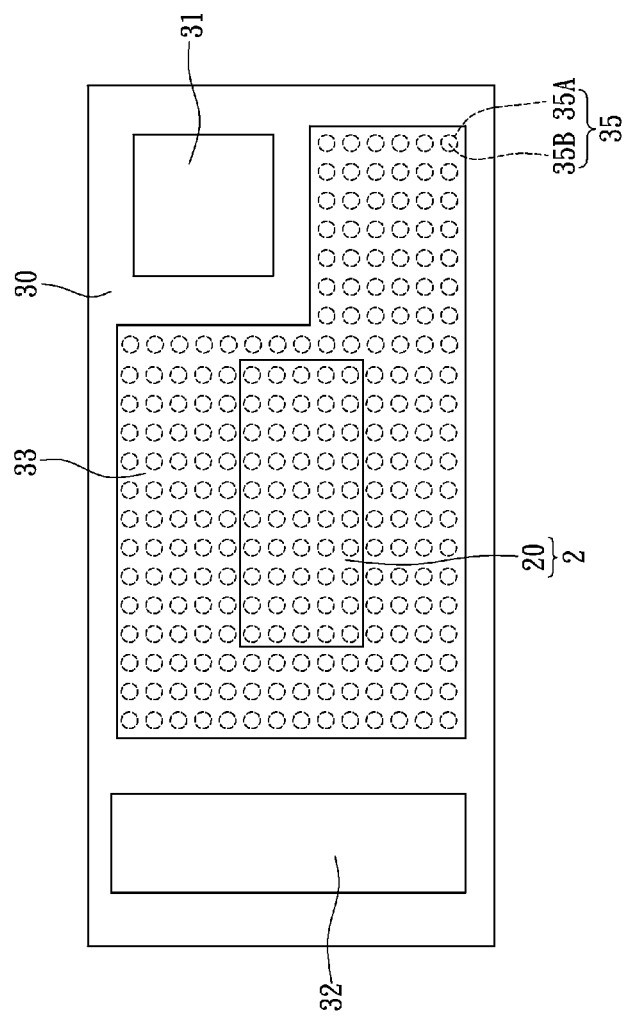
FIG. 8B shows a top, schematic view of the heat-conducting and electrically-insulating element disposed on the top side of the substrate unit according to the eighth embodiment of the instant disclosure.

Referring to FIG. 8A to FIG. 8B, where the eighth embodiment provides yet another light-emitting device. The difference between the eighth embodiment and the seventh embodiment is shown as: the eighth embodiment provides a third conductive frame 13 having a third conductive portion 130 exposed from the casing 14, and the light-emitting chip 15 can be disposed on the first conductive frame 11 and electrically connected to the third conductive frame 13 through the conducting wire W, thus the light-emitting chip 15 can be electrically connected between the first conductive frame 11 and the third conductive frame 13. Hence, as shown in FIG. 8B, the heat-conducting and electrically-insulating layer 20 can be disposed on the heat-dissipating portion 111 of the first conductive frame 11, both the first electrode layer 31 and the second electrode layer 32 can be disposed on two opposite lateral regions of the top side of the substrate body 30, and the top heat-conducting layer 33 can be substantially disposed between the first electrode layer 31 and the second electrode layer 32, according to the design of the positions of the first electrically-conducting portion 110, the third conductive portion 130, and the heat-dissipating portion 111. In other words, when the heat-conducting and electrically-insulating layer 20 is applied to the light-emitting element 1 having at least three conductive frames as shown in the seventh and the eighth embodiments, the designer can design the positions of the first electrode layer 31, the second electrode layer 32, and the top heat-conducting layer 33 on the substrate body 30 according to the light-emitting chip 15 being electrically connected to the second conductive frame 12 or the third conductive frame 13 through the conducting wire W.

In addition, as shown in FIG. 8B, the area of the top heat-conducting layer 33 can be larger than or equal to that of the heat-conducting and electrically-insulating layer 20. As the area of the top heat-conducting layer 33 is increased gradually, the heat-dissipating effect of the light-emitting device is improved accordingly. Of course, the same as other embodiments, the eighth embodiment also can use the penetrating heat-conducting structures 35 and the bottom heat-dissipating layer 34 with the larger area to increase the heat-dissipating effect of the light-emitting device. Moreover, the penetrating heat-conducting structures 35 can only be disposed under the heat-conducting and electrically-insulating layer 20, or the penetrating heat-conducting structures 35 can be distributed under the whole top heat-conductive layer 33. However, the distribution of the penetrating heat-conducting structures 35 can be adjusted according to different requirements, thus the distribution of the penetrating heat-conducting structures 35 in the seventh embodiment is not meant to limit the instant disclosure.

In conclusion, the instant disclosure can plan the heat-conduction path and the electric-conduction path for the light-emitting chip in order to effectively increase the heat-dissipating efficiency of the light-emitting element due to the design of placing the heat-conducting and electrically-insulating layer on the heat-dissipating portion. In addition, even if the light-emitting element uses at least one vertical type LED chip, the light-emitting element also can be disposed on the substrate unit having a heat-dissipating design using a plurality of penetrating heat-conducting structures due to the design of placing the heat-conducting and electrically-insulating layer on the heat-dissipating portion. Hence, no matter what the light-emitting element uses at least one vertical or horizontal type LED chip, the light-emitting element can be disposed on the substrate unit having the penetrating heat-conducting structures for further increasing the heat-dissipating efficiency of the light-emitting device of the instant disclosure.

The above-mentioned descriptions merely represent the preferred embodiments of the instant disclosure, without any intention or ability to limit the scope of the instant disclosure which is fully described only within the following claims Various equivalent changes, alterations or modifications based on the claims of instant disclosure are all, consequently, viewed as being embraced by the scope of the instant disclosure.

What is claimed is:

1. A light-emitting device, comprising:
  a light-emitting element including:
    at least one first conductive frame having at least one first electrically-conducting portion and at least one heat-dissipating portion;
    at least one second conductive frame adjacent to the at least one first conductive frame and having at least one second electrically-conducting portion;
    a casing enclosing the at least one first conductive frame and the at least one second conductive frame, the at least one first electrically-conducting portion, the at least one heat-dissipating portion and the at least one second electrically-conducting portion being exposed from the casing; and at least one light-emitting chip disposed on the at least one first conductive frame; and a heat-conducting and electrically-insulating element including at least one heat-conducting and electrically-insulating layer disposed on the at least one heat-dissipating portion for insulating an electrical current from the at least one heat-dissipating portion;

wherein the light-emitting element has an electrical conduction path passing through the at least one first electrically-conducting portion and the at least one second electrically-conducting portion;

wherein the light-emitting element has a heat-conduction path passing through the heat-dissipation portion and the heat-conducting and electrically-insulating element.

2. The light-emitting device of claim 1, further comprising:
a substrate unit including:
   a substrate body;
   at least one first electrode layer disposed on the top side of the substrate body, corresponding to the at least one first electrically-conducting portion and electrically connected to the at least one first electrically-conducting portion; and
   at least one second electrode layer disposed on the top side of the substrate body, corresponding to the at least one second electrically-conducting portion and electrically connected to the at least one second electrically-conducting portion; and
at least one top heat-conducting layer disposed on the top side of the substrate body, corresponding to the at least one heat-dissipating portion and connected with the at least one heat-dissipating portion through the at least one heat-conducting and electrically-insulating layer.

3. The light-emitting device of claim 2, the substrate unit further comprising:
a plurality of penetrating heat-conducting structures penetrating through the substrate body and located under the at least one top heat-conducting layer.

4. The light-emitting device of claim 3, the substrate unit further comprising:
at least one bottom heat-conducting layer disposed on the bottom side of the substrate body and corresponding to the top heat-conducting layer, wherein the plurality of penetrating heat-conducting structures is disposed between the at least one top heat-conducting layer and the at least one bottom heat-conducting layer.

5. The light-emitting device of claim 4, each of the penetrating heat-conducting structures further comprising:
a penetrating hole penetrating through the substrate body; and
a heat-conducting material absolutely filling the penetrating hole, the heat-conducting material being disposed between the at least one top heat-conducting layer and the at least one bottom heat-conducting layer.

6. The light-emitting device of claim 4, each of the penetrating heat-conducting structures further comprising:
a penetrating hole penetrating through the substrate body; and
a heat-conducting material partially filling the penetrating hole, the heat-conducting material being disposed between the at least one top heat-conducting layer and the at least one bottom heat-conducting layer.

7. The light-emitting device of claim 4, wherein an area of the at least one bottom heat-conducting layer disposed on the bottom side of the substrate body is larger than that of the at least one top heat-conducting layer disposed on the top side of the substrate body.

8. The light-emitting device of claim 2, wherein an area of the at least one top heat-conducting layer disposed on the top side of the substrate body is larger than or equal to that of the at least one heat-conducting and electrically-insulating layer disposed between the at least one heat-dissipating portion and the at least one top heat-conducting layer.

9. The light-emitting device of claim 2, wherein an area of the at least one heat-conducting and electrically-insulating layer disposed between the at least one heat-dissipating portion and the at least one top heat-conducting layer is smaller than or equal to that of the at least one heat-dissipating portion.

10. The light-emitting device of claim 2, wherein the light-emitting element is disposed on the substrate unit, the at least one heat-conducting and electrically-insulating layer corresponds to the at least one top heat-conducting layer and is disposed between the at least one heat-dissipating portion and the at least one top heat-conducting layer.

11. The light-emitting device of claim 2, the at least one top heat-conducting layer further comprising:
a contacting region formed on the top surface thereof and between the at least one first electrode layer and the at least one second electrode layer; and
at least two extending regions respectively connected to two opposite lateral sides of the contacting region;
wherein the at least one heat-conducting and electrically-insulating layer is disposed between the at least one heat-dissipating portion and the contacting region.

12. The light-emitting device of claim 11, wherein the contacting region and the at least two extending regions are connected with each other to form an H shape or an I shape.

13. The light-emitting device of claim 11, wherein the plurality of penetrating heat-conducting structures penetrating through the substrate body is disposed under the contacting region.

14. The light-emitting device of claim 13, wherein the penetrating heat-conducting structures are simultaneously disposed under the contacting region and the two extending regions.

15. The light-emitting device of claim 2, wherein both the at least one first electrode layer and the at least one second electrode layer are disposed on the same lateral region of the top side of the substrate body, and the at least one top heat-conducting layer is disposed on another lateral region of the top side of the substrate body.

16. The light-emitting device of claim 1, the light-emitting element further comprising:
at least one third conductive frame adjacent to the at least one first conductive frame and having at least one third conductive portion;
wherein the least one third conductive frame is enclosed by the casing and the at least one third conductive portion is exposed from the casing.

17. The light-emitting device of claim 16, wherein both the at least one first electrode layer and the at least one second electrode layer are disposed on the same lateral region of the top side of the substrate body, and the at least one top heat-conducting layer is disposed on another lateral region of the top side of the substrate body.

18. The light-emitting device of claim 16, wherein both the at least one first electrode layer and the at least one second electrode layer are disposed on two opposite lateral regions of the top side of the substrate body, and the at least one top heat-conducting layer is substantially disposed between the at least one first electrode layer and the at least one second electrode layer.

19. The light-emitting device of claim 1, wherein the at least one heat-conducting and electrically-insulating layer has a thermal conductivity substantially between 120 W/mk and 500 W/mk.

* * * * *